United States Patent [19]
Chen

[11] Patent Number: 5,631,852
[45] Date of Patent: May 20, 1997

[54] SMART COOLING SECURITY SYSTEM

[75] Inventor: Steve S. Y. Chen, San Jose, Calif.

[73] Assignee: ETEQ Microsystems, Inc., Milpitas, Calif.

[21] Appl. No.: 445,790

[22] Filed: May 22, 1995

[51] Int. Cl.⁶ ........................................... G01K 7/00
[52] U.S. Cl. ................ 364/557; 364/550; 364/707; 395/750
[58] Field of Search ........................ 364/550, 557, 364/707; 395/750; 361/25, 90–93, 103, 687, 688, 690, 694, 695; 318/434

[56] References Cited

U.S. PATENT DOCUMENTS

| | | | |
|---|---|---|---|
| 4,204,249 | 5/1980 | Dye et al. | 395/750 |
| 4,663,539 | 5/1987 | Sharp et al. | 395/750 |
| 4,951,171 | 8/1990 | Tran et al. | 361/90 |
| 5,019,717 | 5/1991 | McCurry et al. | 307/66 |
| 5,249,741 | 10/1993 | Bistline et al. | 361/694 |
| 5,390,350 | 2/1995 | Chung et al. | 364/707 |
| 5,404,546 | 4/1995 | Stewart | 395/750 |
| 5,428,790 | 6/1995 | Harper et al. | 395/750 |
| 5,438,226 | 8/1995 | Kuchta | 361/695 |
| 5,448,143 | 9/1995 | Pecone | 318/434 |
| 5,483,102 | 1/1996 | Neal et al. | 364/557 |
| 5,485,625 | 1/1996 | Gumkowski | 364/707 |
| 5,504,908 | 4/1996 | Ikeda | 364/707 |
| 5,513,361 | 4/1996 | Young | 364/707 |

*Primary Examiner*—Edward R. Cosimano
*Assistant Examiner*—Hal D. Wachsman
*Attorney, Agent, or Firm*—Claude A. S. Hamrick; Emil C. Chang

[57] ABSTRACT

The present invention provides a cooling security system that combines a hardware apparatus with a software routine. The cooling security system detects problems associated with the operation of the fan which is the main component for cooling or heat dissipation, and provides notification of the fan failure to the user via the computer screen. Furthermore, the cooling security system reduces the possibility of overheating by reducing the amount of heat generated by the main heat source, the CPU, by lowering its speed. The present invention also responses to the "GREEN" (Power Down) signal provided by the system board and stops the fan in order to save power.

2 Claims, 3 Drawing Sheets

SMART COOLING SECURITY SYSTEM

CROSS REFERENCE TO APPENDIX

Appendix A, which is part of the present disclosure, consists of eight sheets attached herein and is a listing of the software aspects of the preferred embodiment of the present invention.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

The present invention generally relates to systems for monitoring the operation of fans through the use of electrical circuits, and in particular, to means for detecting the failure of cooling fans in a computer system and generating a plurality of signals in the event of such failure to provide warning messages and to control certain functions of the computer.

2. Description of the Prior Art

Computers generate heat when they are on and the generated heat needs to be dissipated. Heat dissipation in a computer system has a direct relationship to the stability and integrity of the operation of the computer system as well as its life expectancy. When a computer is not properly cooled, the computer may overheat and crash, the integrity of the system board may be compromised, and data may be lost. However, until recently, only the main frame and the mini computer manufacturers devoted any substantial amount of effort to the problem of heat dissipation. As a general proposition, an effective cooling system is expensive because it usually involves either placing the computer in an air-conditioned facility, or placing an expensive cooling system in or around the computer system and regularly servicing the cooling system.

On the other hand, personal computers or work stations such as the IBM or IBM compatible computers, MacIntosh computers, and Sun work stations typically operate at room temperature. In addition, these computers have to be price competitive and cannot afford to include expensive cooling systems. Thus, the extent of their cooling system is comprised of a fan that is part of the power supply, and maybe another fan directly attached to the CPU.

However, as the CPU speed of personal computers exceeds 50 MHz, cooling has become more and more important to the system life of the computer. In the current computer market the CPUs of most of the IBM compatible computers are running at anywhere from 33 MHz to 120 MHz. All of these high speed computer systems require that cooling fans be attached to the CPUs. However, given the fact that the cooling fan has become a critical component of the computer, there is no circuitry that monitors its operation. If the fan fails, the system will not be properly cooled, the temperature can quickly raise, and the system will crash and/or be damaged by the heat. Since the cooling fan is the critical component for providing heat dissipation in the computer system, a smart cooling security system is needed to monitor the cooling fan, and, in the event of a fan failure, to notify the user in an intelligent manner that the cooling fan has failed so that the user can save the files, turn off the power, and replace or repair the fan. To provide for the case where there are no users around, the cooling security system should also operate certain functions of the computer system in order to reduce heat generation.

Currently, there is only one product on the market that deals with the problem of overheating in the personal computer and/or workstation area. This device is a temperature sensor that can be attached to the chassis of the computer. When the temperature reaches a certain degree, the device generates a beeping noise. A computer user hearing the beeping sounds may or may not associate the beeping noise with an overheating condition since the computer generates beeping noises for a variety of reasons. If a user is not around, the computer may eventually overheat and crash. This product simply does not provide an effective method for notifying the user and for preventing an overheating condition. Thus, there is a desire for a low cost cooling security system that can detect potential overheating situations, provide warning messages, and trigger certain system functions to prevent the computer from actual overheating.

SUMMARY OF THE INVENTION

It is an objective of the present invention to provide a cooling security apparatus which monitors the operating condition of a cooling fan for the short circuit condition, the open circuit condition, and a slow/stop condition.

It is another objective of the present invention to provide a cooling security apparatus which provides a message to the computer monitor when the cooling fan fails.

It is yet another objective of the present invention to provide a cooling security apparatus which provides a signal to the computer to decrease the CPU speed in the event the cooling fan fails.

The present invention provides a cooling security system that combines a hardware apparatus with a software routine. The cooling security system detects problems associated with the operation of the fan, which is the main component for cooling or heat dissipation, and provides notification of the fan failure to the user via the computer screen. Furthermore, the cooling security system reduces the possibility of overheating by reducing the amount of heat generated by the main heat source, the CPU, by lowering the its speed.

The preferred embodiment includes a hardware device consisting of a plurality of comparators, resistors, and capacitors that detects the short circuit condition, the open circuit condition, the power-on condition, and the slow/stop condition of the fan. During the power-on condition, the hardware device is barred from detecting the condition of the fan since there is usually a few seconds of set-up time before the computer is at its normal operating level. After powering-up, the hardware device monitors for the short circuit condition, the open circuit condition, and the slow/stop condition. Upon detection of one of these conditions, the hardware device provides a plurality of signals which includes a signal to the high speed/low speed switch of the system to decrease the system speed from high speed to low speed, and a signal to either the serial or parallel port of the computer thereby triggering a piece of memory resident software to display a stored message on the monitor along with beeping sounds. Optionally, signals can be provided to a LED to flash a warning light, to the speaker to generate beeping sounds, or to activate a preprogrammed sound chip.

Most high-end computer systems have a Power Down mode which is a power saving feature that is activated when the computer has not been used for a period of time. The Power Down mode decreases the system speed and turns off the screen in order to save power. During the Power Down mode, the cooling fan does not need to be on. The present invention responds to the GREEN signal generated by the computer system during the Power Down mode by de-activating a NMOS to shut off the fan. As soon as the computer is no longer in the Power Down mode and the NMOS is activated, the fan is turned on again along with the rest of the system. This invention saves power and allows the computer system to be a true "green PC".

The software aspect of the preferred embodiment is a piece of memory resident software that responds to a pre-set interrupt call for the fan failure condition. Upon detection of a fan failure condition, the hardware device generates a signal that is passed to the computer system via the serial or parallel port of the computer to trigger an interrupt call. The software routine catches this interrupt call and executes a program to display an appropriate message on the computer screen.

Note that the present invention is applicable to a variety of motor-driven apparatuses where the operation of the motor is critical to the specific application.

An advantage of the present invention is that it provides a cooling security apparatus which monitors the operating condition of a cooling fan for the short circuit condition, the open circuit condition, and a slow/stop condition.

Another advantage of the present invention is that it provides a cooling security apparatus which causes a message to be displayed on the computer screen along with beeping sounds when the cooling fan fails.

Yet another advantage of the present invention is that it provides a cooling security apparatus which provides a signal to the computer to decrease the CPU speed in the event the cooling fan fails.

IN THE DRAWINGS

DETAILED DESCRIPTION OF THE PREFERRED EMBODIMENT

Figure 1:
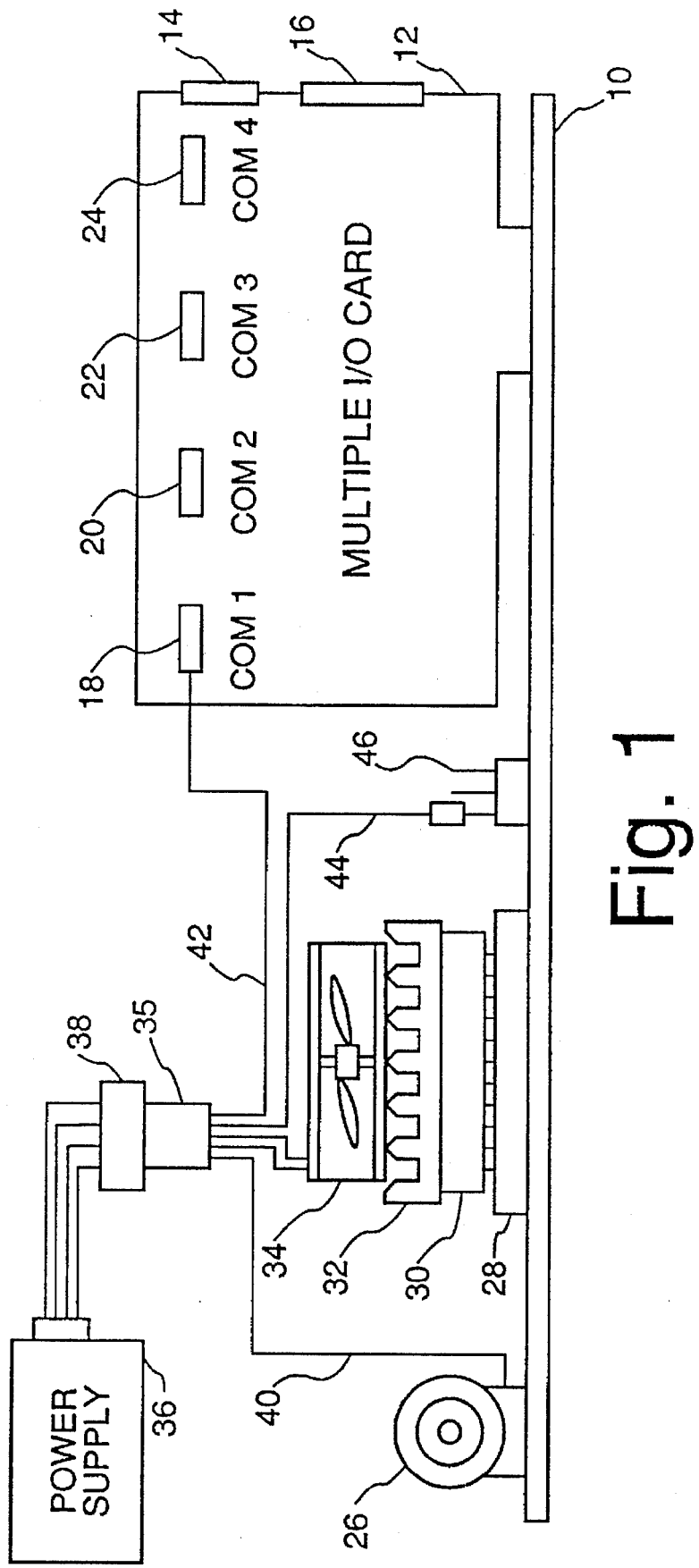
FIG. 1 illustrates an arrangement of the present invention within a computer system.

The present invention includes both hardware and software. FIG. 1 illustrates the placement and interconnections of the hardware device inside a computer system. On the system board 10, there is a multiple-I/O board 12, a set of system function jumper connectors 46, a CPU mount 28, and a speaker 26. The CPU 30 is mounted on the CPU mount 28, and there is a heat sink 32 attached to the top of the CPU 30. The fan unit 34 is attached to the heat sink 32, and an embodiment of the hardware device of the present invention in the form of an electronic circuit device 35 is mounted on the power supply connector 38. The fan unit as well as the hardware device 35 obtains its power from the power supply 36 via connector 38. Upon detection of a fan failure condition, the present invention can transmit signals to the speaker 26 via wire 40, to the selected system function connectors via jumper wire 44, and to a serial or parallel port on the multiple-I/O card 12 via jumper wire 42. Signals to activate other functions can be provided as well. The multiple-I/O card 12 has a number of serial ports represented by COM1 18, COM2 20, COM3 22, and COM4 24, and these ports may be connected to external connectors, 14 and 16, for external connections. The card may provide a number of parallel ports as well (not shown). A signal from the hardware device 35 is connected to COM1 18 such that an interrupt call can be made to trigger a software routine, which is the software aspect of the present invention residing in the memory of the computer.

Figure 2:
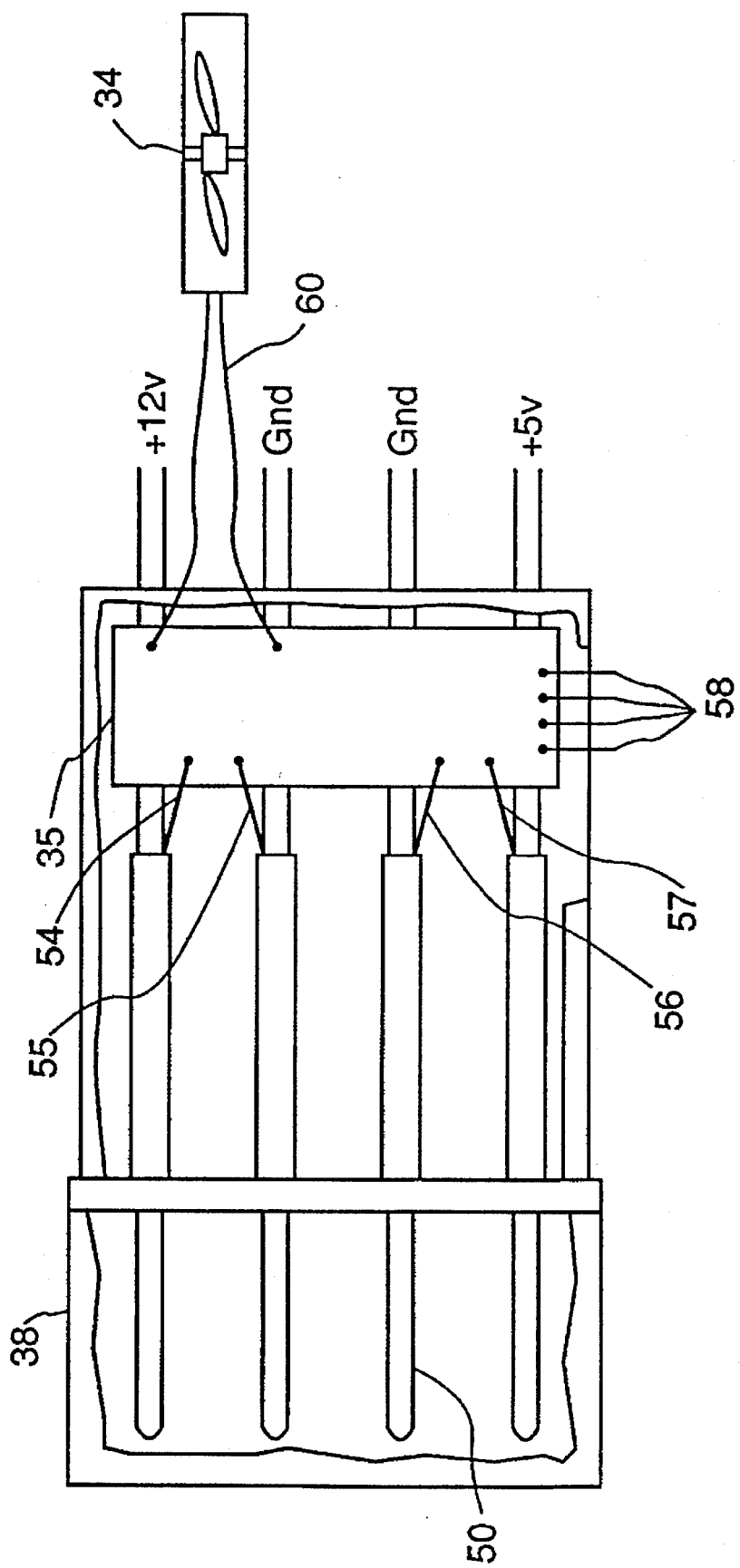
FIG. 2 illustrates an alternative placement of the present invention inside a power connector.

In an alternative arrangement depicted in FIG. 2, the hardware device 35 of the present invention is shown placed entirely within the power connector 38 of the cooling fan. The special power connector is designed to accommodate the hardware device inside the body of the connector. The four standard power lines (5 V, GROUND, GROUND, 12 V) fit in the connector as usual, and 3 or 4 head jumpers at the side of the connector allow the user to use jumper wires to link the signals from the hardware device to the system board. The hardware device 35 obtains its power supply via wires 54–57 and monitors the fan via wire 60. Output leads 58 are provided to connect to the various system functions or calls.

Figure 3:
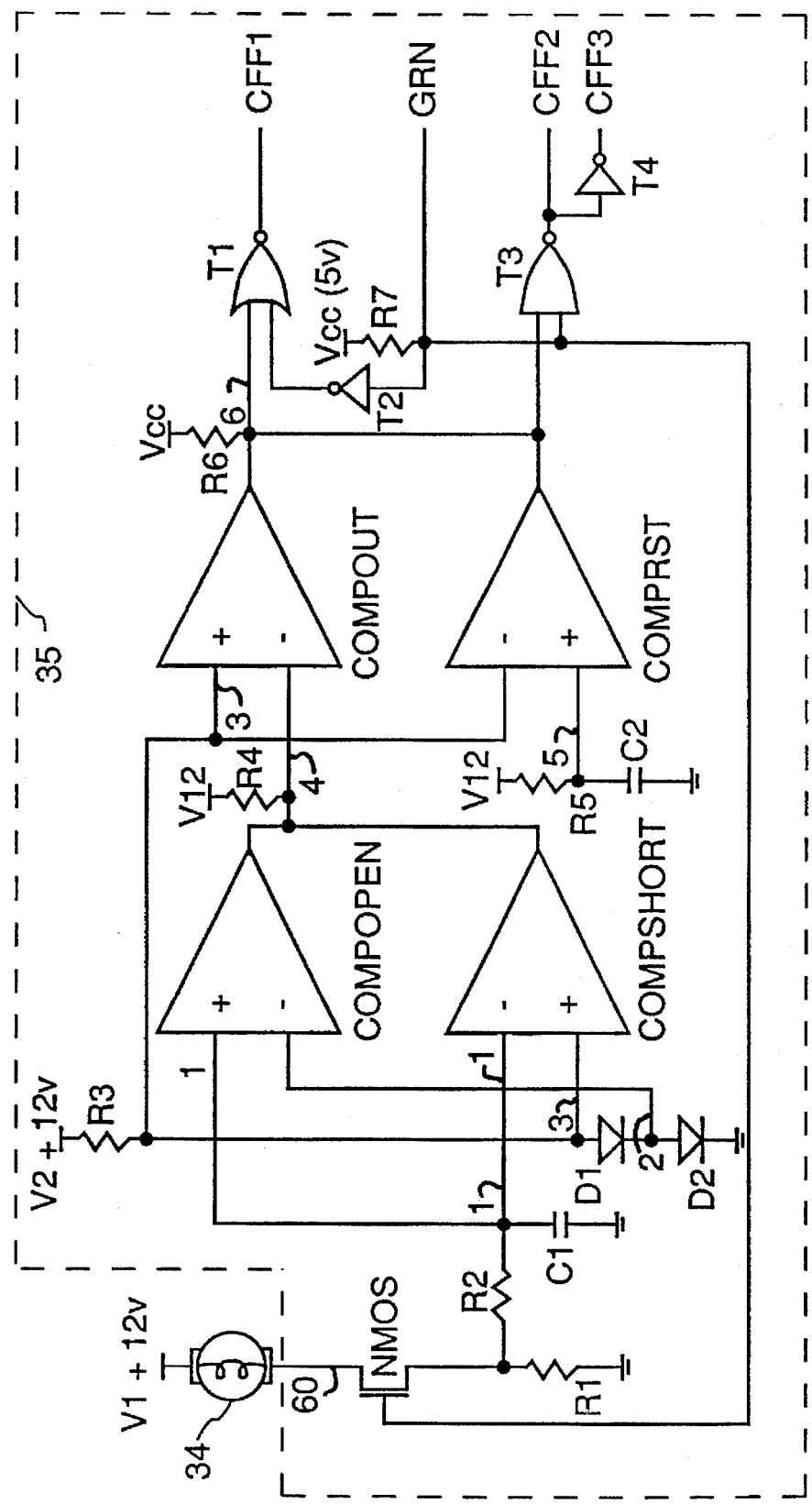
FIG. 3 illustrates the hardware aspect of the preferred embodiment of the present invention.

FIG. 3 illustrates the hardware aspect of the preferred embodiment of the present invention. The hardware device 35 is a mixed design of analog and digital circuitry. The analog circuitry consists of comparators, resistors and capacitors. The analog circuitry monitors the spin, or the current flow, of the cooling fan and responds to the following conditions: the fan stops because of an open circuit condition, the fan stops because of a short circuit condition, and the fan slows down or stops because rotation of the fan is restricted by a foreign object (or dust built-up). Furthermore, there is another comparator, CompRst, which blocks the output signal of the hardware device during the first 10 seconds after the computer is turned ON in order to prevent false detection of the fan operation when the voltage levels for the circuitry have not reach their normal operating ranges.

In the digital portion of the circuitry, a NOR gate receives the signal from CompOut and the GREEN signal, which is taken from the system board through a jumper wire. The output of the NOR gate, CFF1, is linked to the Power Down pin of the clock chip on the system board. When the Power Down pin of the clock chip is enabled, the clock speed for the system is dropped to 8 MHz, and the system generates less heat at 8 MHz and is less likely to overheat.

As illustrated by FIG. 3, a 12 V voltage V1 is supplied to the cooling fan 34 where it is connected a NMOS that is connected to resistor R1 and then to ground. The signal is filtered by R2 and C1 and passed to comparators CompShort and CompOpen. CompShort checks for the short circuit condition by comparing the signal at node 1 with the voltage at node 3, which is voltage V2 after a voltage drop by R3. Similarly, comparator CompOpen checks for an open circuit condition by comparing the signal at node 1 with the voltage at node 2. Note that the signal at node 1 is connected to the positive terminal of CompOpen and the negative terminal of CompShort. The output of CompShort and CompOpen is passed to the negative terminal of CompOut where it is compared to the voltage at node 3. NOR gate T1 accepts the output of CompOut and an inverted input signal, GREEN, which provides for the case where the system board is a board that provides a GREEN signal. NAND gate T3 also accepts the output of CompOut to generate a signal. The output of NAND gate T3 is inverted by invertor T4 to provide a selection of a high signal or low signal. CompRst provides for a time delay when the computer is first turned on by comparing the voltage at node 3 with a time-delayed voltage at node 5. Note that all 4 comparators have open-collector outputs which provide a wired-AND function. During the operation of this circuitry, the following conditions may be encountered:

POWER-ON CONDITION

When the system is first turned ON, the power supply voltages rises from 0 V to 5 V and 12 V respectively. The rising time is normally around 1 second. During this 1 second period not all the signals are at their correct levels. A portion of the circuitry is provided to prevent false detection of the fan operation and triggering of the warning message during the first few seconds after the computer is turned ON. The positive terminal of CompRst is connected to R5 and C2, which has a rising time around 10 seconds. When the 12 V or 5 V power supply is rising, the signal at node 5 is also rising, but at a slower rate than the voltage supply. During the first 10 seconds, voltage at node 5 is lower than the voltage at node 3. The output of CompRst (node 6) consequently stays LOW in the first 10 seconds. The computer system also has a protection circuitry which holds all operations until the power supply reaches the desired levels, and a POWER-GOOD signal is generated, which usually takes about one second. After the first second all the signals are at their correct levels except for the voltage levels for the hardware device of the present invention. After 10 seconds, node 5 rises to +12 V and release the output at node 6 to CompOut. During the ten second rising time, the GREEN signal is high, the CFF1 signal is high, the CFF2 signal is high, and the CFF3 signal is low. Hence, these signals are in the same state as those during normal operation condition.

NORMAL OPERATING CONDITION

When the system is up and running and the cooling fan is working properly, the voltages at the positive terminals of the three comparators, CompShort, CompOpen, and CompRst, are higher than the respective voltages at the negative terminals of the comparators. While for comparator CompOut the voltage at the negative terminal is higher than the voltage at the positive terminal (node 3). Thus, the output signal (at node 6) is LOW. With the GREEN signal from the system board being HIGH, the output signal CFF1 is HIGH, CFF2 is HIGH and CFF3 is LOW. Note that the GREEN, CFF1, and CFF2 signals are active low signals, and CFF3 is an active HIGH signal.

OPEN CIRCUIT CONDITION

In the case where the system is up and running but the cooling fan fails because of the open circuit condition (i.e. the coil of the cooling fan is open), the voltage at node 1 drops to 0 V. The voltage at the positive terminal of CompOpen will be lower than the voltage at the negative terminal. This causes the output at node 4 to drop to 0 V and the output at node 6 to rise from LOW to HIGH. Consequently, the CFF1 signal switches to LOW, the CFF2 signal switches to LOW, and the CFF3 signal switches to HIGH.

SHORT CIRCUIT CONDITION

In the case when the system is up and running but the cooling fan fails because of the short circuit condition (i.e. the coil of the cooling fan shorted), the voltage at node 1 rises to 12 V. The voltage at the negative terminal of CompShort will be higher than the voltage at the positive terminal. This condition causes the signal at node 4 to drop to 0 V and causes the signal at node 6 to rise from LOW to HIGH. Consequently, the CFF1 signal switches to LOW, the CFF2 signal switches to LOW, and the CFF3 signal switches to HIGH.

SLOW/STOP CONDITION

In the case where the system is up and running but the cooling fan slows or is stopped by a foreign object, the motor draws more current from the power supply and causes the voltage at node 1 to rise about 400 to 600 mV. The voltage at the negative terminal of CompShort will be higher than the voltage at the positive terminal. While during normal operation the voltage at the positive terminal is set to around 200 mV higher than the voltage at the negative terminal (node 3 at +1.1 V and node 1 at +0.9 V), the 400–600 mV rise in voltage at the negative terminal changes the voltage at node 1 to 1.3 V or above and changes the output level of CompShort. The output at node 4 drops to 0 V and causes the voltage at node 6 to rise from LOW to HIGH. Consequently, the CFF1 signal switches to LOW, the CFF2 signal switches to LOW, and the CFF3 signal switches to HIGH.

POWER-DOWN (GREEN) CONDITION

In the case where the system is in the power down mode and the cooling fan is working properly, the GREEN signal from the system board will be LOW. The CFF1 signal is switched to LOW, and the system CLK drops to 8 MHz. However, the CFF2 signal stays HIGH and the CFF3 signal stays LOW. No interrupt signal is generated, and no warning messages will be displayed on the screen. Additionally, the NMOS transistor is turned off and the fan stops.

EFFECT OF THE CFF1 SIGNAL

The CFF1 signal is sent to the clock chip (on the system board or within the CPU) to lower the CLK signal to 8 MHz or less. In effect, the CPU runs at a lower speed, generates less heat, and the system is protected from overheating.

EFFECT OF THE CFF2 AND CFF3 SIGNALS

In one case, an active CFF2 signal triggers the execution of the software routine which causes the warning message stored in memory to be displayed on the screen and causes beeping sounds. The displayed message warns the user that the cooling fan has failed, informs the user that the system is running now at a lower speed, and advises the user to replace the fan. The CFF2 signal is sent to the system board through either serial ports, COM1, COM2, COM3, or COM4, parallel ports, LPT1, LPT2, LPT3, or any other port which can receive a system interrupt signal. The selected port is connected via a jumper wire.

The CFF2 signal can also be sent directly to the system board via a jumper wire to the system board to trigger one of the system interrupt (IRQ) signals. The signal in turn triggers the software routine to display messages on the screen and to generate beeping sounds.

The CFF2 signal can also be sent to the keyboard controller via a jumper wire. The Keyboard controller then generates an interrupt signal to notify the system BIOS. The system BIOS starts the software routine to fetch the messages stored in the BIOS ROM or memory and display the message on the screen.

The CFF2 signal can also be hooked to a LED. When the CFF2 signal is active (i.e. the CFF2 signal is switched from HIGH to LOW), the current flows from Vcc (5 v) to ground and through ground to CFF2, which causes the LED to light-up to notify the user that the cooling fan has failed. In the same manner, the CFF2 signal can be connected to a beeper, a speaker, or a voice mail subsystem to generate an audio message indicating that the fan has failed.

The CFF3 signal has the same function as the CFF2 signal but providing opposite logic level, i.e. when CFF2 is HIGH, CFF3 is LOW and vice versa. The CFF3 signal is for logic functions that respond to a falling edge rather than a rising edge signal.

Software Aspect of the Preferred Embodiment

The software aspect of the preferred embodiment is enclosed herein as appendix A. The software program can be loaded into the system memory as part of the boot-up procedure during power up. Here, the software program is loaded in memory on an IBM compatible system with the command "eteqload". The program gets the original vector address, loads the new interrupt service routine to the default vector 0x0F (the default port) or the user selected port, and uses the default error message.

When the cooling fan fails and the selected port interrupt is detected, the screen is cleared, the error message is displayed on the center of the screen for five seconds, and the computer beeps. This warning procedure is repeated five times.

The software routine is written in a such manner that the warning message has the highest priority for display on the screen, no matter which operating system and application software are running. As soon as the fan fails, the message will be displayed on the screen to notify the user.

The software can also be placed in the system BIOS as firmware, which means that the message is stored in the BIOS ROM. The BIOS monitors the CFF2 signal, and starts the software routine to send the messages to the screen when the CFF2 signal is active. Examples of some possible messages are as follow:

Warning: The cooling fan has failed. Please save your file(s) and replace the fan.

Warning: The cooling fan has failed. The computer is now running at 8 MHz. Please save your file(s) and replace the fan.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

APPENDIX A

The cooling security system generates a positive to negative TTL signal (LPT version), or an RS232C signal (COM version), when an fan failure condition is detected.

The software provided includes the following sample interrupt service routines:

```
LPT1:   ETEQ_P1,   (port 3BC, IRQ7)
LPT2:   ETEQ_P2,   (port 378, IRQ5)
LPT3:   ETEQ_P3,   (port 278, IRQ7)
COM1:   ETEQ_S1,   (port 3F8, IRQ4)
COM2:   ETEQ_S2,   (port 2F8, IRQ3)
COM3:   ETEQ_S3,   (port 378, IRQ4)
COM4:   ETEQ_S4,   (port 278, IRQ3)
```

These routines load the provided interrupt service routine at the appropriate interrupt service vector (IRQ5 and IRQ7 for LPT, and IRQ3 and IRQ4 for COM).

The interrupt service routine will remain dormant until the associated IRQ (Interrupt Service reQuest) is activated.

The interrupt service routine (ISR) saves the registers, displays the following message on the console:

The cooling fan has failed. Please replace it.

The ISR then restores the registers and is returned to a dormant state until the next interrupt is detected.

The installation of this interrupt service routine can be implemented by entering the following command at the MS-DOS prompt:

eteq_p1

(This example is for the LPT1: port). This command may also be included in the AUTOEXEC.BAT file for automatic installation during the MS-DOS boot.

CODE REVIEW

Parallel Port Interrupt Service Code

*Comments*

```
;;
;;
;;           Interrupt Service Install and Routine
;;           LPT1:
;;
;;           21Mar95     donw    Original
;;
;;
```

*Parallel port selection*

```
        LPT       EQU    3BCh       ;; LPT1 port used, [normally use IRQ7]
        ;; LPT   EQU    378h       ;; LPT2 port used, [normally use IRQ5]
        ;; LPT   EQU    278h       ;; LPT3 port used, [normally use IRQ7]
```

*Interrupt selection*

```
        ;; Use with IRQ5
        ;; VECTOR    EQU    0Dh    ;; interrupt to use, 0Dh=IRQ5, 0Fh=IRQ7
        ;; VEC_MASK  EQU    0DFh   ;; mask to use,      DFh=IRQ5, 7Fh=IRQ7
```

*Interrupt mask selection*

```
        ;; Use with IRQ7
        VECTOR     EQU    0Fh      ;; interrupt to use, 0Dh=IRQ5, 0Fh=IRQ7
        VEC_MASK   EQU    7Fh      ;; mask to use,      DFh=IRQ5, 7Fh=IRQ7
```

*Code segment declaration and address*

```
        CSEG       SEGMENT
                   ASSUME    CS:CSEG,DS:CSEG
                   ORG       100h
```

*Beginning of code, go to START*

```
        start:     JMP    initialize
```

*Beginning of ISR*

```
        ctcq_isr PROC   NEAR
```

*Disable interrupts*

```
                   CLI              ;; turn off interrupts
```

*Save registers*

```
                   ;; save registers
                   PUSH   AX        ;; save ax register
                   PUSH   BX        ;; save bx register
                   PUSH   DX        ;; save dx register
                   PUSH   DS        ;; save ds register
```

*Set Data Segment to Code Segment*

```
                PUSH    CS              ;; copy cs register
                POP     DS              ;; to ds register
```

*Jump around data area*

```
                JMP     intsvc2         ;; jump around data around
```

*Screen message area*

```
                ;; Data Area
     Err_Msg    DB
                0Dh,0Ah,0Ah,0Ah,0Ah,0Ah,0Ah,0Ah,0Ah,0Ah,0Ah,0Ah,0Ah
                DB      ' The cooling fan has failed.  Please replace it.'
                DB      0Dh,0Ah,0Ah,0Ah,0Ah,0Ah,0Ah,0Ah,0Ah,0Ah,0Ah,0Ah,7,0 intsvc2:   ;; check status
```

*Verify defined LPT generated interrupt*

```
                MOV     DX,LPT+1        ;; set up for status port
                IN      AL,DX           ;; get status
                TEST    AL,40h          ;; check acknowledged bit
                JZ      intsvc5         ;; exit if bit not set
                AND     AL,0BFh         ;; mask off acknowledged bit
                OUT     DX,AL           ;; write back
```

*Set up console message*

```
     intsvc3:   LEA     DI,Err_Msg      ;; pointer to error string
     intsvc4:   MOV     AL,CS:[DI]      ;; get byte from string
                CMP     AL,0            ;; check for termination
                JE      intsvc5         ;; if 0, exit
                INC     DI              ;; increment pointer MOV     AH,0Eh          ;; Call DOS function
                MOV     BL,04h          ;; set color
                INT     10h
                JMP     intsvc4         ;; continue loop
```

*Restore registers*

```
     intsvc5:   ;; restore registers, setup interrupt, exit
                POP     DS              ;; restore ds register
                POP     DX              ;; restore dx register
                POP     BX              ;; restore bx register
```

*Notify interrupt controller*

```
                ;; send interrupt EOI (End-Of-Interrupt) signal
                MOV     AL,20h          ;; turn on bit and
                OUT     20h,AL          ;; send EOI to 8259
                STI                     ;; turn on interrupts POP     AX              ;; restore ax register
```

*End of ISR*

```
                IRET
     etcq_isr   ENDP
```

*Begining of set vector routine*
```
        initialize:   CLI                      ;; turn off interrupts
```

*Setup interrupt service routine vector*
```
                      MOV   BX,CS              ;; Make dx point to this segment
                      MOV   DS,BX              ;;  that this code is in
                      LEA   DX,ctcq_isr        ;; pointer to interrupt handler
                      MOV   AL,VECTOR          ;; interrupt number
                      MOV   AH,25h             ;; set interrupt vector
                      INT   21h                ;; set DOS interrupt
```

*Setup parallel port interrupt enable*
```
                      MOV   DX,LPT+2           ;; get parallel port control register
                      IN    AL,DX              ;; read values
                      OR    AL,10h             ;; set interrupt enable bit
                      OUT   DX,AL              ;; set enable interrupt
```

*Enable associated interrupt*
```
                      IN    AL,21h             ;; read 8259 enable mask
                      AND   AL,VEC_MASK        ;; mask our interrupt
                      OUT   21h,AL             ;; send mask
                      STI                      ;; turn on interrupts
```

*Exit interrupt loader*
```
                      LEA   DX,initialize      ;; prepare to exit
                      INT   27h                ;; exit
```

*End of program*
```
        CSEG          ENDS
                      END   start
```

Serial Port Interrupt Service Code

*Comments*

```
;;
;;      Interrupt Service Install and Routine
;;      COM1:
;;
;;      21Apr95      donw   Original
;;      22Apr95 donw  Added interrupt chaining code
;;
```

*Serial port selection*

| | | | |
|---|---|---|---|
| COM | EQU | 3F8h | ;; COM1 port used, [normally use IRQ4] |
| COMN | EQU | 1 | ;; COM1 port number |
| ;; COM | EQU | 2F8h | ;; COM2 port used, [normally use IRQ3] |
| ;; COMN | EQU | 2 | ;; COM2 port number |
| ;; COM | EQU | 3E8h | ;; COM3 port used, [normally use IRQ4] |
| ;; COMN | EQU | 3 | ;; COM3 port number |
| ;; COM | EQU | 2E8h | ;; COM4 port used, [normally use IRQ3] |
| ;; COMN | EQU | 4 | ;; COM4 port number |

*Interrupt selection*

```
        ;; Use with IRQ3
        ;; VECTOR    EQU    0Bh       ;; interrupt to use, 0Bh=IRQ3, 0Ch=IRQ4
        ;; VEC_MASK  EQU    0F7h      ;; mask to use,      F7h=IRQ3, EFh=IRQ4

;; Use with IRQ4
        VECTOR       EQU    0Ch       ;; interrupt to use, 0Bh=IRQ3, 0Ch=IRQ4
        VEC_MASK     EQU    0EFh      ;; mask to use,      F7h=IRQ3, EFh=IRQ4
```

*Code segment declaration and address*

```
        CSEG         SEGMENT
                     ASSUME    CS:CSEG,DS:CSEG
                     ORG       100h
```

*Beginning of code, go to START*

```
        start:       JMP    initialize
```

*Beginning of ISR*

```
        etcq_isr     PROC   NEAR
```

*Disable interrupts*

```
                     CLI              ;; turn off interrupts
```

*Save registers*

```
                     ;; save registers
                     PUSH   AX        ;; save ax register
                     PUSH   BX        ;; save bx register
                     PUSH   DX        ;; save dx register
                     PUSH   DS        ;; save ds register
```

Set Data Segment to Code Segment

```
                PUSH    CS              ;; copy cs register
                POP     DS              ;; to ds register
```

Jump around data area

```
                JMP     intsvc2         ;; jump around data around
```

Screen message area

```
                        ;; Data Area
        Err_Msg DB      0Dh,0Ah,0Ah,0Ah,0Ah,0Ah,0Ah,0Ah,0Ah,0Ah,0Ah,0Ah,0Ah
                DB      '   The cooling fan has failed.  Please replace it.'
                DB      0Dh,0Ah,0Ah,0Ah,0Ah,0Ah,0Ah,0Ah,0Ah,0Ah,0Ah,0Ah,0Ah,7,0
        ;; Old_Handler  DW      0,0,0,0
```

Verify defined LPT generated interrupt

```
        intsvc2:        ;; check status
                MOV     DX,COM+6        ;; set up for modem status register
                IN      AL,DX           ;; get status TEST    AL,01h          ;; check CTS bit
;;              TEST    AL,02h          ;; check DSR bit
;;              TEST    AL,04h          ;; check RI  bit
;;              TEST    AL,08h          ;; check DCD bit
                JZ      intsvc5         ;; exit if bit not set
```

Set up console message

```
        intsvc3:        LEA     DI,Err_Msg      ;; pointer to error string
        intsvc4:        MOV     AL,CS:[DI]      ;; get byte from string
                        CMP     AL,0            ;; check for termination
                        JE      intsvc5         ;; if 0, exit
                        INC     DI              ;; increment pointer MOV     AH,0Eh          ;; Call DOS function
                        MOV     BL,04h          ;; set color
                        INT     10h
                        JMP     intsvc4         ;; continue loop
```

Restore registers

```
        intsvc5:        ;; restore registers, setup interrupt, exit
                POP     DS              ;; restore ds register
                POP     DX              ;; restore dx register
                POP     BX              ;; restore bx register
```

Notify interrupt controller

```
                ;; send interrupt EOI (End-Of-Interrupt) signal
                MOV     AL,20h          ;; turn on bit and
                OUT     20h,AL          ;; send EOI to 8259
                STI                     ;; turn on interrupts POP     AX              ;; restore ax register
;;              CALL    Old_Handler     ;; process original routine
```

*End of ISR*

```
                    IRET
    eteq_isr        ENDP
```

*Begining of set vector routine*

```
    initialize:     CLI                         ;; turn off interrupts

MOV     BX,CS               ;; make sure code segment is
                    MOV     DS,BX               ;; the data segment
```

*Setup interrupt service routine vector*

```
    ;;              MOV     AL,VECTOR           ;; setup the interrupt vector
    ;;              MOV     AH,35h              ;; set GET INTERRUPT VECTOR
    ;;              INT     21h                 ;; get vector
    ;;              MOV     Old_Handler,BX      ;; save old interrupt vector
    ;;              MOV     Old_Handler[2],ES LEA     DX,eteq_isr         ;; pointer to new interrupt handler
                    MOV     AL,VECTOR           ;; interrupt number
                    MOV     AH,25h              ;; set interrupt vector
                    INT     21h                 ;; set DOS interrupt
```

*Setup serial port parameters*

```
                    MOV     AX,00E3h            ;; set 9600 N81
                    MOV     DX,COMN             ;; set Com port number
                    INT     14h                 ;; initialize port MOV     DX,COM+4            ;; get serial Modem Control Register
                    MOV     AL,0Bh              ;; set -DTR, -RTS, and -OUT2 low
                    OUT     DX,AL               ;; initialize control register
```

*Setup serial port interrupt enable*

```
                    MOV     DX,COM+1            ;; set up Interrupt Enable Register
                    MOV     AX,0080h            ;; Enable modem status change interrupt
                    OUT     DX,AL               ;; set enable bit
```

*Enable associated interrupt*

```
                    IN      AL,21h              ;; read 8259 enable mask
                    AND     AL,VEC_MASK         ;; mask our interrupt
                    OUT     21h,AL              ;; send mask
                    STI                         ;; turn on interrupts
```

*Exit interrupt loader*

```
                    LEA     DX,initialize       ;; prepare to exit
                    INT     27h                 ;; exit
```

*End of program*

```
    CSEG            ENDS
                    END     start
```

Build Process

Note: the highlighted areas in the beginning of the code review sections allow modification of the desired port and interrupt vector. The provided code uses the default port addresses and interrupts.

*The following commands uses Microsoft development tools*

```
eteq_p1.com:    eteq_p1.asm
    masm eteq_p1, eteq_p1, eteq_p1;
    link eteq_p1;
    exe2bin eteq_p1.exe eteq_p1.com
    del eteq_p1.exe eteq_s1.com:    eteq_s1.asm
    masm eteq_s1, eteq_s1, eteq_s1;
    link eteq_s1;
    exe2bin eteq_s1.exe eteq_s1.com
    del eteq_s1.exe
```

What I claim is:

1. In a computer system, a cooling security system for monitoring at least one cooling fan having an operating condition and generating a signal in response to said operating condition, comprising:

means for detecting a short circuit condition of the cooling fan and generating a first signal in response to said short circuit condition;

means for detecting an open circuit condition of the cooling fan and generating a second signal in response to said open circuit condition;

means for detecting a slow or stopped condition of the cooling fan and generating a third signal in response to said slowed or stopped condition;

means for responding to said first signal, said second signal, and said third signal to generate a first stage signal;

means for deactivating said first stage signal for a predetermined period of time when said computer system is first turned on;

a NOR gate for processing said first stage signal and a GREEN signal to produce a first output signal;

a NAND gate for processing said first stage signal and said GREEN signal to produce a second output signal; and an invertor means for inverting said second output signal to produce a third output signal.

2. A cooling security system as recited in claim 1 wherein said first output signal in an active state causes generation of an interrupt call to execute a software program to display a warning message on a computer screen of said computer system.

* * * * *